United States Patent [19]

Olivo et al.

[11] Patent Number: 5,469,389
[45] Date of Patent: Nov. 21, 1995

[54] SEMICONDUCTOR MEMORY WITH MEMORY MATRIX COMPRISING REDUNDANCY CELL COLUMNS ASSOCIATED WITH SINGLE MATRIX SECTORS

[75] Inventors: Marco Olivo, Bergamo; Luigi Pascucci, Sesto S. Giovanni, both of Italy

[73] Assignee: SGS-Thomson Microelectronics s.r.l., Milan, Italy

[21] Appl. No.: 219,204

[22] Filed: Mar. 29, 1994

[30]   Foreign Application Priority Data

Mar. 31, 1993 [EP] European Pat. Off. ............ 93830128

[51] Int. Cl.$^6$ ............................................. G11C 29/00
[52] U.S. Cl. .............. 365/200; 365/189.07; 365/230.02; 365/230.06
[58] Field of Search .............................. 365/200, 230.02, 365/230.06, 189.07

[56]   References Cited

U.S. PATENT DOCUMENTS 5,293,348  3/1994  Abe ........................ 365/200 X 5,295,101  3/1994  Stephens, Jr. et al. ................ 365/200

FOREIGN PATENT DOCUMENTS

0472209A2  2/1992  European Pat. Off. .
0491523A1  6/1992  European Pat. Off. .
0492099A2  7/1992  European Pat. Off. .

*Primary Examiner*—Do Hyun Yoo
*Attorney, Agent, or Firm*—David V. Carlson; Seed and Berry

[57]   ABSTRACT

There is described a semiconductor memory including a matrix of rows and columns of memory cells, wherein the columns are grouped together in sectors, each sector representing the portion of the matrix itself related to a data input/output line. Each sector is in turn divided into packets of columns, and there are redundancy columns suitable for replacing a matrix column containing defective memory cells. Each of the redundancy columns is included in a respective packet. The memory also includes control circuits to execute the abovementioned replacement.

15 Claims, 2 Drawing Sheets

SEMICONDUCTOR MEMORY WITH MEMORY MATRIX COMPRISING REDUNDANCY CELL COLUMNS ASSOCIATED WITH SINGLE MATRIX SECTORS

TECHNICAL FIELD

The present invention relates to a semiconductor memory with memory matrix comprising redundancy cell columns associated with single matrix sectors.

BACKGROUND OF THE INVENTION

In the manufacture of semiconductor memories defects are frequently encountered that afflict a limited number of cells of the memory matrix. The reason for the high probability of defects of this type resides in the fact that in a semiconductor memory chip the greater part of the area is occupied by the matrix of memory cells itself.

In order to avoid that the presence of a limited number of defective memory cells on many millions force the rejection of the entire chip, the technique is known of providing for the manufacture of a certain number of additional memory cells, commonly called "redundancy cells", to be used as a replacement of those cells that, during testing of the integrated component, prove defective; the circuits, with which the integrated component must of necessity be provided, designed to operate the abovementioned functional replacement of a defective cell with a redundancy cell are indicated as a whole with the name of "redundancy circuits", while the set of redundancy cells and circuits are defined for short as "redundancy".

Since semiconductor memories are organized in matrix structures wherein the single memory cells are located at the intersection of rows (known as "word lines") and of columns (known as "bit lines") of the matrix itself, what takes place in practice is the replacement of those rows or of those columns containing defective cells with as many rows or columns of redundancy cells (known as "redundancy rows" and "redundancy columns", respectively), storing the configuration of address signals corresponding to each defective line or column in special non-volatile memory registers (for example, fuses, or programmable but non-erasable memory cells) so that whenever said combination of address signals shows up again at the input of the integrated component, the replacement is automatically executed and, instead of accessing the defective cells, access is gained to the redundancy cells that replace them.

A first embodiment of redundancy provides for the presence of groups of redundancy bit lines, where each of these groups is associated with a respective sector of the memory matrix, comprising a given number of bit lines of memory cells, constituting the portion of the memory matrix itself related to a data input/output line of the integrated component.

For the purposes of the selection of a particular bit line, each of the abovementioned sectors is generally in turn divided into packets of bit lines, say eight packets of eight bit lines each for a total of 64 bit lines in each sector.

The selection of a given bit line among the 64 bit lines constituting a sector is executed by means of a twin-level decoding of the address signals: one among eight signals known as being of the first level is triggered to select one among the eight bit lines of each packet, while the triggering of one among eight signals known as being of the second level allows the selection of one among the eight packets. Said first- and second-level signals generally drive transistors that are placed in series with the bit lines and that connect the latter to the reading circuit of the memory cells.

In this type of embodiment the selection of one of the redundancy bit lines is also executed by means of two levels of selection signals, where signals of the first level execute the selection of a redundancy bit line among those constituting one group, while a single second-level signal allows the connection of the group of redundancy bit lines to the reading circuit. The redundancy circuits proceed with the triggering of these first- and second-level signals related to the redundancy bit lines, and at the same time they inhibit the triggering of the signals for the selection of the bit line of the matrix containing the effective memory cell.

An architecture such as the one described poses some problems, however, in the design of the integrated circuit layout. In order to program the memory cells, in fact, with each of the abovementioned packets of matrix bit lines, as well as with the redundancy bit lines, there is associated a programming loading circuit, comprising a transistor that, depending on the data to be stored in the single memory cell, connects the bit line selected by the first-level signals to a programming voltage. Since the current required by the memory cell for its programming is generally fairly high, the size of said transistor is consequently fairly substantial. This circumstance does not present particular problems for transistors associated with packets of matrix bit lines, where the pitch between two of these transistors is, say, of eight bit lines; since, however, a group of redundancy bit lines is generally constituted by a smaller number of bit lines, the space available for the design of the corresponding programming transistor is restricted, and it is necessary to introduce irregularities in its size or in its design.

A second type of embodiment is known, wherein with the entire complex of the packets of matrix bit lines and of the group of redundancy bit lines there is associated a single loading circuit, of the type described earlier. It is evident that in this second type of architecture the problems that are found in the first type of architecture described do not exist, since the pitch between two successive programming transistors consists of many bit lines.

But in this case the programming transistor is no longer connected to the selected bit line through the first-level selection transistor only, but, rather, through the connection of the latter to the second-level selection transistor. This allows a limited regulation of the programming voltage across the drain of the memory cell to be programmed, due to the additional drop in voltage across the second-level selection transistor. Moreover, in order to limit this additional drop in voltage across the second-level selection transistor, it is necessary for the second-level selection signal to have a value that is higher than the programming voltage, with the consequent complication of the decoding circuits.

Lastly, since in order to speed up testing operations it is usual to program several bits simultaneously, the programming transistor must, in this second architecture, be able to drive a multiple number of bit lines simultaneously; this means that its size must be larger than that of a programming transistor for architectures of the type described earlier, and layout problems may arise.

In view of the described state of the prior art, the object of the present invention is to manufacture a semiconductor memory with a matrix architecture such that the abovementioned problems are avoided when providing redundant circuits or carrying out redundancy operations.

SUMMARY OF THE INVENTION

According to the present invention, such object is attained by a semiconductor memory, comprising a matrix of memory cells located at the intersection of rows and columns of the matrix itself, the single columns of the memory cells being grouped together in packets and said packets being in turn grouped together in sectors, the sectors all together forming the matrix itself. There is a first-level selection means for the selection of a particular column inside each packet, second-level selection means for the selection of a particular packet inside each sector, columns of redundancy memory cells suitable for replacing columns containing at least one defective memory cell, and control circuits to execute the abovementioned replacement. Each of the redundancy cell columns is included in a respective packet of memory cell columns.

Advantageously, the present invention permits the manufacture of matrices of memory cell in which it is no longer necessary to provide specific loading circuits for programming the cells of redundancy columns, as the latter are connected to the loading circuit of a packet of columns. This has a substantial benefit from the viewpoint of the layout of the memory matrix.

These and other features of the present invention shall be made more evident by the following detailed description of the invention.

DETAILED DESCRIPTION OF THE INVENTION

Figure 1:
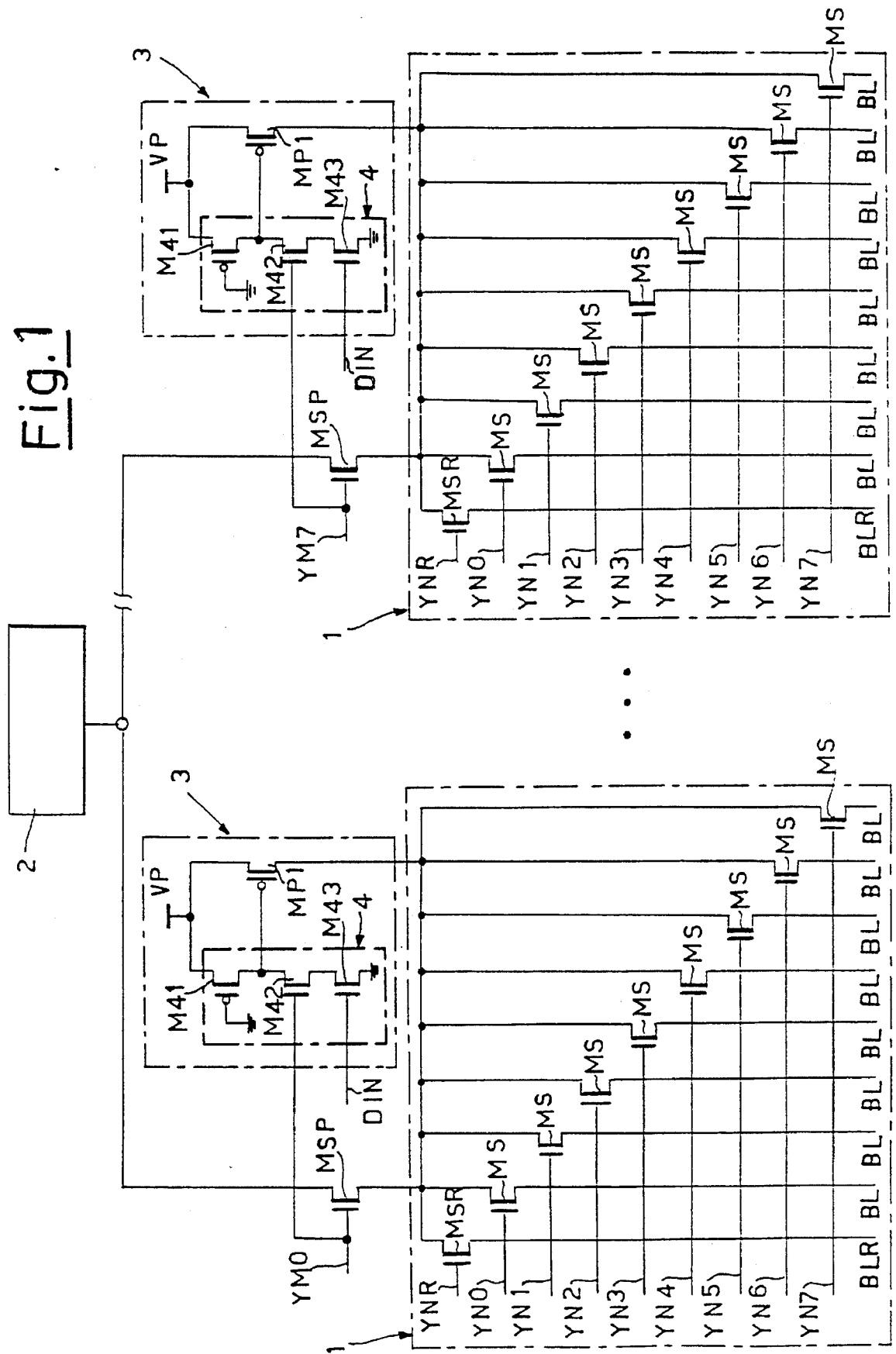
FIG. 1 shows a sector of a memory matrix for a semiconductor memory according to the invention.

There is illustrated in FIG. 1 a memory sector that represents the portion of a matrix of memory cells related to a data input/output line, and is divided in a selected number of packets 1 of columns or bit lines, say eight. In one embodiment there are eight bit lines in each packet 1, but in other embodiments each packet contains a number of bit lines in the range of from two bit lines, up to 64, 256 or more bit lines.

In the embodiment in which each of the packets 1 includes eight matrix bit lines BL, and one redundancy bit line BLR, it follows that each sector of eight packets consists of 64+8 bit lines.

Figure 2:
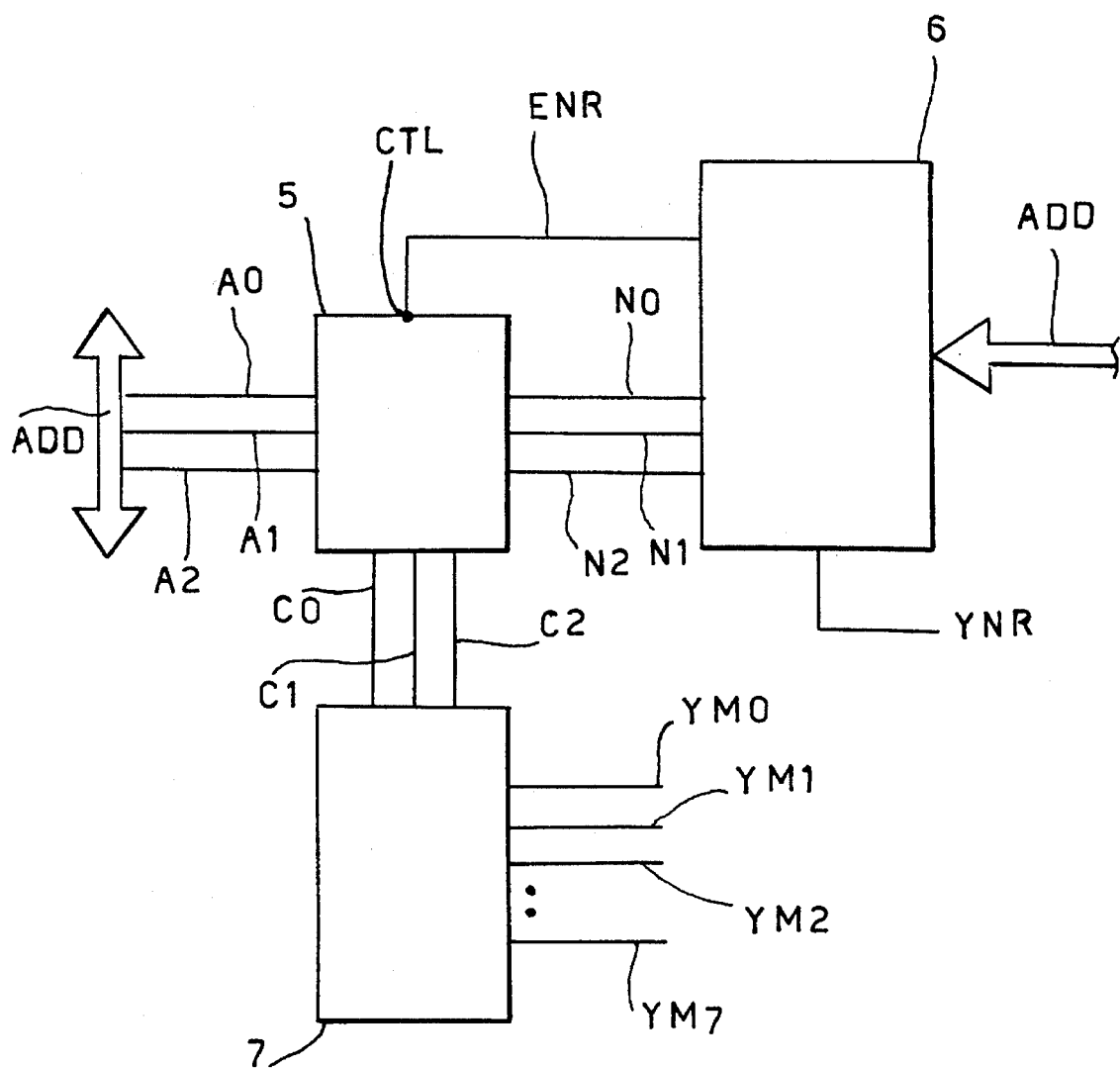
FIG. 2 shows a block diagram of the circuits constituting the selection means of a packet of bit lines belonging to said sector of a memory matrix.

Within each packet 1, in series with each bit line BL there is a transistor MS for the selection of the bit line BL. The transistor MS may be of the n-channel MOS type whose source is connected to the bit line BL itself. The redundancy bit line BLR is also connected to the source of a transistor MSR for the selection of the redundancy bit line BLR itself. The drains of the transistors MS and MSR of any one packet 1 are electrically connected to one another, while their gates are connected to eight lines for receiving signals YN0–YN7 and to a signal YNR, respectively. The signals YN0–YN7 are provided from the circuit (not shown in the figures) for decoding the address signals. The signal YNR is generated by a circuit 6 for recognizing the address signals corresponding to defective memory cells, as shown in FIG. 2 and explained in more detail elsewhere herein. The eight signals YN0–YN7 and the signal YNR constitute a first level of selection.

To the common drain of the transistors MS and MSR of any one packet 1 there is also connected the source of a transistor MSP for the selection of a particular packet 1 of bit lines. In one embodiment each sector includes eight packets. The drain of each respective MSP transistor is electrically connected to the drain of the seven other transistors MSP related to the other seven packets 1 of the sector. This common drain line is connected to a circuit 2 for reading the informative content of the memory cells. The gates of the MSP transistors are connected to eight lines for receiving signals YM0–YM7, coming from a further decoding circuit 7 of the address signals, shown in FIG. 2.

Connected to the common drain of the transistors MS and MSR of each packet 1 is a loading circuit 3 for programming, constituted by a transistor MP1 of the p-channel MOS type whose drain is connected to the abovementioned common drain of the transistors MS and MSR, whose source is connected to a line placed at a programming voltage VP, and whose gate is connected to the output of a circuit 4 accomplishing the NAND logic function.

The NAND circuit 4 comprises a loading transistor M41 of the p-channel MOS type with the source connected to the line placed at the voltage VP, the drain connected to the gate of the transistor MP1 and gate connected to a ground potential. To the drain of the transistor M41 there is connected the drain of a transistor M42, and to the source of the latter there is connected the drain of a transistor M43, whose source is on the other hand connected to the ground potential. To the gate of the transistor M42 there is connected one of the eight signals YM0–YM7, while to the gate of the transistor M43 there is connected a signal DIN representing the data to be programmed in the selected memory cell.

There are shown in FIG. 2 controls circuits 5, 6, 7 for the generation of the eight signals YM0–YM7 and of the signal YNR. They comprise a multiplexer circuit 5, provided with two groups of input lines, respectively connected to a sub-set A0–A2 of address signals ADD and to the outputs N0–N2 of a circuit 6 for recognizing the repaired addresses. The recognition circuit 6 in turn receives as inputs the address signals ADD, and also provides an output signal ENR to enable the redundancy connected to a control input CTL of the multiplexer 5, and the output signal YNR. The recognition circuit 6, per se, is known in the prior art and many of the circuits known in the prior art as suitable for this purpose are acceptable.

The multiplexer 5 is also provided with three output lines C0–C2, constituting inputs for the selection of the packet 1 of the decoding circuit 7. The eight output lines of circuit 7 constitute the second-level selection signals YM0–YM7. The decoding circuit 7, per se, is also known in the prior art and many of the circuits known in the prior art as suitable for this purpose are acceptable.

When reading data stored in a non-defective memory cell, the address signals ADD (or a sub-set thereof) are presented across the inputs of the circuit 6 and a sub-set of the address signals ADD comprised of A0–A2 are presented on the input of multiplexer 5. The circuit 6 will recognize that the present address does not correspond to the address of a defective cell and thus does not trigger the signal ENR. The address of the defective cells has previously been stored during the memory testing step. Consequently the multiplexer 5 presents at its outputs C0–C2 the sub-set A0–A2 of the address signals ADD; such signals A0–A2 are thus decoded by the circuit 7 with the purpose of triggering one of the eight signals YM0–YM7 for the selection of one of the packets 1 of bit lines BL. At the same time one of the signals YN0–YN7 is triggered, for the selection of a bit line BL among those of the selected packet 1. In this way the reading circuit 2 is connected to the drain of the selected memory cell, and can as a consequence execute the reading of the data.

The same sequence occurs when a non-defective memory cell is to be programmed. In this case, however, as a result of the signal DIN constituting the data to be stored, the selected bit line BL can then be connected to the programming voltage VP. In fact, if the signal DIN is active, the transistor M43 is on. The loading circuit 3 related to the packet 1 selected, say by means of the signal YMO, shall have both inputs DIN and YMO of the NAND circuit 4 active, the output of said NAND circuit 4 shall go to the ground potential, and thus the programming transistor MP1, whose gate is connected to the output of said NAND circuit 4, shall be on; this allows the selected bit line BL to go to the programming voltage VP.

On the other hand, if access to a defective memory cell is attempted, either to read its content or to program it, the circuit 6 recognizes that the combination of address signals ADD corresponds to the address of a defective cell; it thus triggers the signal ENR that switches the output of the multiplexer 5 to the signals N0–N2 coming from the circuit 6 itself and carrying in a coded form the address useful for the selection of the redundancy bit line BLR that has replaced the bit line BL containing the defective matrix cell.

The decoding of the signals N0–N2 by the decoding circuit 7 guarantees the triggering of one of the eight signals YM0–YM7, suitable for selecting the packet 1 containing the redundancy bit line BLR that has replaced the defective bit line BL. Simultaneously the circuit 6 triggers the signal YNR, while all the signals YN0–YN7 are deactivated, so that inside the particular packet 1 selected by the corresponding signal YM0–YM7 the redundancy bit line BLR is selected. The signals YN0–YN7 can be deactivated by any one of many acceptable circuits or techniques. For example, the signal YNR can be used as an input to disable the output of the decoding circuit (not shown because a standard decoding circuit is suitable) that supplies the signals YN0–YN7 to prevent them from being provided. Other circuits or techniques to disable the signals YN0–YN7, once it is known that the address is to a defective bit, could also be used.

Advantageously, the circuit combination used for the generation of the signals YM0–YM7 prevents these latter from being linked, in the case of an address corresponding to a defective cell, to the combination of the sub-set A0–A2 of the address signals ADD; it is thus possible to replace the bit line BL containing the defective cell with any of the eight bit lines BLR of the same sector, and not just with the bit line BLR of the packet 1 to which the defective bit line BL also belongs. If, in fact, a prior access and circuit combination were to be used for the generation of the signals YM0–YM7, wherein the latter would always be generated starting from the signals A0–A2, a defective bit line BL could be replaced only by the redundancy bit line BLR belonging to the same packet 1 as the bit line BL. This would have as an undesired consequence that whenever there were to be two or more defective bit lines BL in a packet 1, the entire memory would have to be rejected, even though there would be other redundancy bit lines BLR in other packets 1 available for use.

It is also advantageous that because of the described architecture for the selection of the redundancy bit line BLR, only one additional signal, YNR, is necessary over and above the signals YN0–YN7 and YM0–YM7 normally necessary for the selection of the bit lines BL of the matrix, while in the previous redundancy embodiments as many distinct selection signals are necessary as there are redundancy bit lines BLR.

While the figures show that the sub-set of address signals for selecting a replacement bit line is comprised of three signals for selecting one of eight, the number of signals in the sub-set could consist of fewer or more signals, such as four, six, eight or more, if desired.

We claim:

1. A semiconductor memory comprising:

a matrix of memory cells located at the intersection of rows and columns of the matrix, the columns of memory cells being grouped together in packets and said packets being grouped together in sectors, the sectors together forming said matrix;

a first-level selection means for the selection of a particular column inside each packet in response to first-level selection signals;

second-level selection means for the selection of a particular packet inside each sector in response to second-level selection signals;

redundancy columns of redundancy memory cells suitable for replacing defective columns containing at least one defective memory cell, each of said redundancy columns being included in a respective packet of the matrix;

selection means for the selection of one of said redundancy columns as an alternative to the memory cell columns of the packets to which the redundancy columns belong;

a decoding circuit supplied with packet address signals for generating said second-level selection signals to drive said second-level selection means; and control circuits to execute the replacement of a defective column with a redundancy column, said control circuits including a recognition circuit for storing the addresses of each defective column and of a respective substitutive redundancy column, for comparing address signals externally supplied to the memory with the addresses of the defective columns; and switching means controlled by the recognition circuit to supply said decoding circuit with the packet address signals represented either by a sub-set of the externally supplied address signals or by signals supplied by the recognition circuit representing a sub-set of the address of one redundancy column respectively when the recognition circuit recognizes that the externally supplied address signals do not correspond or do correspond to a defective column, respectively.

2. The semiconductor memory according to claim 1, characterized in that said switching means are constituted by a a multiplexer, the multiplexer having:

a first input channel supplied with said sub-set of the externally supplied address signals;

a second input channel supplied with said sub-set of the address of one redundancy column;

an output channel supplying said packet address signals to the decoding circuit; and a control input supplied with a control signal supplied by the recognition circuit.

3. The semiconductor memory according to claim 1, characterized in that said first-level and second-level selection means include transistors.

4. The semiconductor memory according to claim 1 characterized in that with each packet of each sector there is associated a loading circuit for programming the memory cells.

5. The semiconductor memory according to claim 1 characterized in that each of said packets of each sector contains one of said redundancy columns.

6. A method of selecting a usable memory cell in a matrix comprising:

receiving a plurality of memory address signals at a recognition circuit;

receiving a first sub-set of the plurality of memory address signals at a multiplexer;

comparing the plurality of memory address signals received at said recognition circuit with addresses of defective memory cells;

permitting the multiplexer to output the first sub-set of memory address signals when the plurality of memory address signals do not specify a defective memory cell;

inputting a second sub-set of memory address signals to the multiplexer when the plurality of memory address signals specify a defective memory cell;

enabling the multiplexer to output the second sub-set of memory address signals when the plurality of memory address signals specify a defective memory cell.

7. The method according to claim 6, further including:

outputting a bit line selection signal from the recognition circuit when the plurality of memory address signals specify a defective memory cell.

8. The method according to claim 6, further including:

generating the second sub-set of memory address signals in the recognition circuit in response to the plurality of memory address signals being recognized as specifying a defective memory cell.

9. The method according to claim 6, further including:

storing address locations of defective memory cells in the recognition circuit prior to performing the comparing.

10. A semiconductor memory comprising:

a matrix of memory cells located at the intersection of rows and columns of the matrix itself, the columns being grouped together in packets and said packets being in turn grouped together in sectors, the sectors together forming the matrix itself;

first level selection means for the selection of a particular column inside each packet in response to first-level selection signals;

second-level selection means for the selection of a particular packet inside each sector in response to second-level selection signals;

redundancy columns of redundancy memory cells suitable for replacing defective columns containing at least one defective memory cell, each of said redundancy columns being included in a respective packet of columns of the matrix; and control circuits for executing replacement of the redundancy columns for the defective columns, said control circuits comprising:

a recognition circuit for storing defective addresses of the defective columns and addresses of the redundancy columns replacing the defective columns, and for comparing memory address signals with said defective addresses;

a decoding circuit for decoding packet address signals of said memory address signals, and for generating the second-level selection signals to drive said second-level selection means; and a multiplexer for supplying said decoding circuit with the packet address signals when the recognition circuit does not recognize that the memory address signals correspond to any one of said defective addresses, or with the addresses of the redundancy columns stored in the recognition circuit when the recognition circuit recognizes that the memory address signals correspond to one of said defective addresses.

11. The semiconductor memory according to claim 10, further comprising:

selection means for the selection of the redundancy column of a given packet as an alternative to the columns of the matrix belonging to said given packet.

12. The semiconductor memory according to claim 10, further comprising a plurality of loading circuits for programming the memory cells, each loading circuit being associated to a respective one of said packets.

13. The semiconductor memory according to claim 10, characterized in that each of said packets of each sector contains one of said redundancy columns.

14. A circuit structure for selecting a usable memory cell in a matrix comprising:

an address recognition circuit coupled to receive an external address;

a signal generating circuit as part of said address recognition circuit, said signal generating circuit outputting a first selection signal when an address does not correspond to a defective memory cell and outputting a second selection signal when an address corresponds to an address of a defective memory cell; and a multiplexer coupled to the address recognition circuit and coupled to receive at least a portion of the external address and also coupled to receive at least a portion of an address of a redundant memory cell, the multiplexer outputting the address corresponding to at least said portion of the external address when the external address does not correspond to a defective memory cell and outputting the address provided by the address recognition circuit corresponding to at least said portion of the redundant memory cell address when the external address corresponds to a defective memory cell.

15. A circuit structure of claim 14 further comprising a decoding circuit coupled to said multiplexer to receive at least said portion of the external address or the redundant memory cell address output by the multiplexer.

\* \* \* \* \*

UNITED STATES PATENT AND TRADEMARK OFFICE
CERTIFICATE OF CORRECTION

PATENT NO. : 5,469,389
DATED : November 21, 1995
INVENTOR(S) : Marco Olivo, Luigi Pascucci It is certified that error appears in the above-indentified patent and that said Letters Patent is hereby corrected as shown below:

In column 6, claim 2, line 58, following "a", please delete "a".

Signed and Sealed this

Ninth Day of July, 1996

Attest:

BRUCE LEHMAN

*Attesting Officer*       *Commissioner of Patents and Trademarks*